United States Patent
Im et al.

(10) Patent No.: US 6,555,449 B1
(45) Date of Patent: Apr. 29, 2003

(54) METHODS FOR PRODUCING UNIFORM LARGE-GRAINED AND GRAIN BOUNDARY LOCATION MANIPULATED POLYCRYSTALLINE THIN FILM SEMICONDUCTORS USING SEQUENTIAL LATERAL SOLIDFICATION

(75) Inventors: James S. Im, New York, NY (US); Robert S. Sposili, New York, NY (US); Mark A. Crowder, New York, NY (US)

(73) Assignee: Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 09/390,535

(22) Filed: Sep. 3, 1999

Related U.S. Application Data (63) Continuation-in-part of application No. PCT/US96/07730, filed on May 28, 1996, application No. 09/200,533, filed on Nov. 27, 1998, now Pat. No. 6,322,625.

(51) Int. Cl.[7] .......................... H01L 21/20; H01L 21/36
(52) U.S. Cl. ........................ 438/487; 438/482; 438/486
(58) Field of Search .................................. 438/486, 488, 438/482, 487; 219/121.61, 121.69, 121.7, 121.72; 359/9, 15, 559, 569, 599; 430/17, 170, 273.1, 320, 322

(56) References Cited

U.S. PATENT DOCUMENTS

| | | | | |
|---|---|---|---|---|
| 4,793,694 A | * | 12/1988 | Liu .............................. | 359/494 |
| 5,145,808 A | | 9/1992 | Sameshima et al. | |
| 5,742,426 A | * | 4/1998 | York ........................... | 359/298 |

(List continued on next page.)

FOREIGN PATENT DOCUMENTS

| | | | |
|---|---|---|---|
| GB | 2338342 | | 12/1999 |
| GB | 2338343 A | * | 12/1999 |
| GB | 2338343 A | * | 9/2000 |
| WO | WO-97/45827 | * | 12/1997 |
| WO | 0118854 | | 3/2001 |
| WO | 0118855 | | 3/2001 |

OTHER PUBLICATIONS

Endert et al., "Excimer laser: A new tool for precision Micromaching", Optical and Quantum electronics, vol. 27 (1995), 1319–1335.*

Sposili et al., "Single–Crystal Si Films via a Low–Substrate–Temperature Excimer–Laser Crystallization Method", Mat. Res. Soc. Symp. Proc. vol. 452, pp. 953–958, 1997 Materials Reasearch Society.*

(List continued on next page.)

*Primary Examiner*—Michael Sherry
*Assistant Examiner*—Asok Kumar Sarkar
(74) *Attorney, Agent, or Firm*—Baker Botts L.L.P.

(57) ABSTRACT

Methods for processing an amorphous silicon thin film sample into a polycrystalline silicon thin film are disclosed. In one preferred arrangement, a method includes the steps of generating a sequence of excimer laser pulses, controllably modulating each excimer laser pulse in the sequence to a predetermined fluence, homoginizing each modulated laser pulse in the sequence in a predetermined plane, masking portions of each homogenized fluence controlled laser pulse in the sequence with a two dimensional pattern of slits to generate a sequence of fluence controlled pulses of line patterned beamlets, each slit in the pattern of slits being sufficiently narrow to prevent inducement of significant nucleation in region of a silicon thin film sample irradiated by a beam let corresponding to the slit, irradiating an amorphous silicon thin film sample with the sequence of fluence controlled slit patterned beamlets to effect melting of portions thereof corresponding to each fluence controlled patterned beamlet pulse in the sequence of pulses of patterned beamlets, and controllably sequentially translating a relative position of the sample with respect to each of the fluence controlled pulse of slit patterned beamlets to thereby process the amorphous silicon thin film sample into a single or polycrystalline silicon thin film.

23 Claims, 5 Drawing Sheets

U.S. PATENT DOCUMENTS

| | | | | | |
|---|---|---|---|---|---|
| 5,844,588 | A | * | 12/1998 | Anderson | 347/135 |
| 5,861,991 | A | * | 1/1999 | Fork | 359/618 |
| 5,986,807 | A | * | 11/1999 | Fork | 359/569 |
| 6,072,631 | A | * | 6/2000 | Guenther et al. | 359/569 |
| 6,081,381 | A | * | 6/2000 | Shalapenok et al. | 359/619 |
| 6,117,752 | A | | 9/2000 | Suzuki | |
| 6,177,301 | B1 | * | 1/2001 | Jung | 438/150 |
| 6,203,952 | B1 | * | 3/2001 | O'Brien et al. | 430/17 |
| 6,285,001 | B1 | * | 9/2001 | Fleming et al. | 219/121.72 |
| 6,300,175 | B1 | * | 10/2001 | Moon | 438/158 |
| 6,326,186 | B1 | * | 12/2001 | Park et al. | 438/478 |

OTHER PUBLICATIONS

Im et al., "Controlled Super–Lateral Growth of Si Films for Microstructural Manipulation and Optimization". Phys. Stat. Sol. (a), 166, pp. 603–617 (1998).*

Kim, H. J., "Excimer–Laser–Induced Crystallization of Amorophus Silicon Thin Films", Ph. D. Dissertation Abstract, Columbia University, 1996.*

Sposili et al., Sequential lateral Solodification of thin Silicon Films on SiO2, appl. Phys. Lett., 69(19), p 2864, 1996.*

Im et al., Single–Crystal Si Films for Thin–Film Transistor Devices, App. Phys. Lett., 70 (25), p 3434, 1997.*

C. E. Nebel, "Laser Interference Structuring of A–SI:h" Amorphous Silicon Technology—1996, San Francisco, CA Apr. 8–12, 1996, Materials Research Society Symposium Proceedings, vol. 420, Pittsburgh, PA.

J. H. Jeon et al., "Two–step laser recrystallization of poly–Si for effective control of grain boundaries", Journal of Non Crystalline Solids, North–Holland Publishing Company, NL, vol. 266–269, May 2000, pp. 645–649.

S.D. Brotherton et al., "Influence of Melt Depth in Laser Crystallized Poly–Si Thin Film Transistors," 82 J. Appl. Phys. 4086 (1997).

J.S. Im et al., "Crystalline Si Films for Integrated Active–Matrix Liquid–Crystal Displays," 21 MRS Bulletin 39 (1996).

"Overview of Beam Delivery Systems for Excimer Lasers," Micro/Las Lasersystem GMBH.

K.H. Weiner et al., "Ultrashallow Junction Formation Using Projection Gas Immersion Laser Doping (PGILD)," A Verdant Technologies Technical Brief, Aug. 20, 1997.

I.W. Boyd, "Laser Processing of Thin Films and Microstructures, Oxidation, Deposition, anmd Etching of Insulators" (Springer—Verlag Berlin Heidelberg 1987), p. 118–119.

H. Endert et al., "Excimer Laser: A New Tool for Precision Micromaching," 27 Optical and Quantum Electronics, 1319 (1995).

* cited by examiner

METHODS FOR PRODUCING UNIFORM LARGE-GRAINED AND GRAIN BOUNDARY LOCATION MANIPULATED POLYCRYSTALLINE THIN FILM SEMICONDUCTORS USING SEQUENTIAL LATERAL SOLIDFICATION

CROSS REFERENCE TO RELATED APPLICATIONS

This application is a continuation-in-part application of: (i) International Application No. PCT/US96/07730, filed on May 28, 1996 and published in English on Dec. 4, 1997 (the "Grandparent Application"), and (ii) co-pending U.S. patent application Ser. No. 09/200,533 (the "Parent Application") filed on Nov. 27, 1998 (and issued as U.S. Pat. No. 6,322, 625 on Nov. 27, 2001), which is a continuation application of the Grandparent Application. Thus, the present application claims priority from the Grandparent and Parent Applications under 35 U.S.C. § 120.

NOTICE OF GOVERNMENT RIGHTS

The U.S. Government has certain rights in this invention pursuant to the terms of the Defense Advanced Research Project Agency award number N66001-98-1-8913.

BACKGROUND OF THE INVENTION

I. Field of the Invention

The present invention relates to techniques for semiconductor processing, and more particularly to semiconductor processing which may be performed at low temperatures.

II. Description of the Related Art

In the field of semiconductor processing, there have been several attempts to use lasers to convert thin amorphous silicon films into polycrystalline films. For example, in James Im et al., "Crystalline Si Films for Integrated Active-Matrix Liquid-Crystal Displays," 11 MRS Bullitin 39 (1996), an overview of conventional excimer laser annealing technology is presented. In such a system, an excumer laser beam is shaped into a long beam which is typically up to 30 cm long and 500 micrometers or greater in width. The shaped beam is scanned over a sample of amorphous silicon to facilitate melting thereof and the formation of polycrystalline silicon upon resolidification of the sample.

The use of conventional excimer laser annealing technology to generate polycrystalline silicon is problematic for several reasons. First, the polycrystalline silicon generated in the process is typically small grained, of a random microstructure, and having a nonuniform grain sizes, therefore resulting in poor and nonuniform devices and accordingly, low manufacturing yield. Second, in order to obtain acceptable performance levels, the manufacturing throughput for producing polycrystalline silicon must be kept low. Also, the process generally requires a controlled atmosphere and preheating of the amorphous silicon sample, which leads to a reduction in throughput rates. Accordingly, there exists a need in the field to generate higher quality polycrystalline silicon at greater throughput rates. There likewise exists a need for manufacturing techniques which generate larger and more uniformly microstructured polycrystalline silicon thin films to be used in the fabrication of higher quality devices, such as flat panel displays.

SUMMARY OF THE INVENTION

An object of the present invention is to provide techniques for producing uniform large-grained and grain boundary location controlled polycrystalline thin film semiconductors using the sequential lateral solidification process.

A further object of the present invention is to form large-grained and grain boundary location manipulated polycrystalline silicon over substantially the entire semiconductor sample.

Yet another object of the present invention is to provide techniques for the fabrication of semiconductors devices useful for fabricating displays and other products where the predominant orientation of the semiconductor grain boundaries may be controllably aligned or misaligned with respect to the current flow direction of the device.

In order to achieve these objectives as well as others that will become apparent with reference to the following specification, the present invention provides methods for processing an amorphous silicon thin film sample into a polycrystalline silicon thin film are disclosed. In one preferred arrangement, a method includes the steps of generating a sequence of excimer laser pulses, controllably modulating each excimer laser pulse in the sequence to a predetermined fluence, homoginizing each modulated laser pulse in the sequence in a predetermined plane, masking portions of each homogenized fluence controlled laser pulse in the sequence with a two dimensional pattern of slits to generate a sequence of fluence controlled pulses of line patterned beamlets, each slit in the pattern of slits being sufficiently narrow to prevent inducement of significant nucleation in region of a silicon thin film sample irradiated by a beamlet corresponding to the slit, irradiating an amorphous silicon thin film sample with the sequence of fluence controlled slit patterned beamlets to effect melting of portions thereof corresponding to each fluence controlled patterned beamlet pulse in the sequence of pulses of patterned beamlets, and controllably sequentially translating a relative position of the sample with respect to each of the fluence controlled pulse of slit patterned beamlets to thereby process the amorphous silicon thin film sample into a single or polycrystalline silicon thin film.

In a preferred arrangement, the masking step includes masking portions of each homogenized fluence controlled laser pulse in said sequence with a two dimensional pattern of substantially parallel straight slits spaced a predetermined distance apart and linearly extending parallel to one direction of said plane of homogenization to generate a sequence of fluence controlled pulses of slit patterned beamlets. Advantageously, the translating provides for controllably sequentially translating the relative position of the sample in a direction perpendicular to each of the fluence controlled pulse of slit patterned beamlets over substantially the predetermined slit spacing distance, to the to thereby process the amorphous silicon thin film sample into polycrystalline silicon thin film having long grained, directionally controlled crystals.

In an especially preferred arrangement, the masking step comprises masking portions of each homogenized fluence controlled laser pulse in the sequence with a two dimensional pattern of substantially parallel straight slits of a predetermined width, spaced a predetermined distance being less than the predetermined width apart, and linearly extending parallel to one direction of the plane of homogenization to generate a sequence of fluence controlled pulses of slit patterned beamlets. In this arrangement, translating step comprises translating by a distance less than the predetermined width the relative position of the sample in a direction perpendicular to each of the fluence controlled pulse of slit patterned beamlets, to the to thereby process the amorphous silicon thin film sample into polycrystalline silicon thin film having long grained, directionally controlled crystals using just two laser pulses. In one exemplary embodiment, the predetermined width is approximately 4 micrometers, the predetermined spacing distance is approximately 2 micrometers, and the translating distance is approximately 3 micrometers.

In an alternative preferred arrangement, the masking step comprises masking portions of each homogenized fluence controlled laser pulse in the sequence with a two dimensional pattern of substantially parallel straight slits spaced a predetermined distance apart and linearly extending at substantially 45 degree angle with respect to one direction of the plane of homogenization to generate a sequence of fluence controlled pulses of slit patterned beamlets. In this arrangement, the translating step provides for controllably sequentially translating the relative position of the sample in a direction parallel to the one direction of the plane of homogenization over substantially the predetermined slit distance, to thereby process the amorphous silicon thin film sample into polycrystalline silicon thin film having long grained, directionally controlled crystals that are disoriented with respect to the XY axis of the thin silicon film.

In yet another preferred arrangement, the masking step comprises masking portions of each homoginized fluence controlled laser pulse in the sequence with a two dimensional pattern of intersecting straight slits, a first group of straight slits being spaced a first predetermined apart and linearly extending at substantially 45 degree angle with respect to a first direction of the plane of homogenization, and a second group of straight slits being spaced a second predetermined distance apart and linearly extending at substantially 45 degree angle with respect to a second direction of the plane of homogenization and intersecting the first group at substantially a 90 degree angle, to generate a sequence of fluence controlled pulses of slit patterned beamlets. The corresponding translating step provides for controllably sequentially translating the relative position of the sample in a direction parallel to the first direction of the plane of homogenization over substantially the first predetermined slit spacing distance, to thereby process the amorphous silicon thin film sample into polycrystalline silicon thin film having large diamond shaped crystals.

In still another alternative arrangement, the masking step comprises masking portions of each homoginized fluence controlled laser pulse in the sequence with a two dimensional pattern of sawtooth shaped slits spaced a predetermined distance apart and extending generally parallel to one direction of the plane of homogenization to generate a sequence of fluence controlled pulses of slit patterned beamlets. In this arrangement, the translating step provides for controllably sequentially translating the relative position of the sample in a direction perpendicular to each of the fluence controlled pulse of slit patterned beamlets over substantially the predetermined slit spacing distance, to the to thereby process the amorphous silicon thin film sample into polycrystalline silicon thin film having large hexagonal crystals.

In a modified arrangement, an alternative technique for processing an amorphous silicon thin film sample into a polycrystalline silicon thin film using a polka-dot pattern is provided. The technique includes generating a sequence of excimer laser pulses, homoginizing each laser pulse in the sequence in a predetermined plane, masking portions of each homoginized laser pulse in the sequence with a two dimensional pattern of substantially opaque dots to generate a sequence of pulses of dot patterned beamlets, irradiating an amorphous silicon thin film sample with the sequence of dot patterned beamlets to effect melting of portions thereof corresponding to each dot patterned beamlet pulse in the sequence of pulses of patterned beamlets, and controllably sequentially translating the sample relative to each of the pulses of dot patterned beamlets by alternating a translation direction in two perpendicular axis and in a distance less than the super lateral grown distance for the sample, to thereby process the amorphous silicon thin film sample into a polycrystalline silicon thin film.

The accompanying drawings, which are incorporated and constitute part of this disclosure, illustrate a preferred embodiment of the invention and serve to explain the principles of the invention.

BRIEF DESCRIPTION OF THE DRAWINGS

FIG. 9b is an instructive diagram illustrating mask translation using the mask of FIG. 9a;

DESCRIPTION OF PREFERRED EMBODIMENTS

The present invention provides techniques for producing uniform large-grained and grain boundary location controlled polycrystalline thin film semiconductors using the sequential lateral solidification process. In order to fully understand those techniques, the sequential lateral solidification process must first be appreciated.

The sequential lateral solidification process is a technique for producing large grained silicon structures through small-scale unidirectional translation of a silicon sample in between sequential pulses emitted by an excimer laser. As each pulse is absorbed by the sample, a small area of the sample is caused to melt completely and resolidify laterally into a crystal region produced by the preceding pulses of a pulse set.

A particularly advantageous sequential lateral solidification process and an apparatus to carry out that process are disclosed in our co-pending patent application entitled "Systems and Methods using Sequential Lateral Solidification for Producing Single or Polycrystalline Silicon Thin Films at Low Temperatures," filed concurrently with the present application and assigned to the common assignee, the disclosure of which is incorporated by reference herein. While the foregoing disclosure is made with reference to the particular techniques described in our co-pending patent application, it should be understood that other sequential lateral solidification techniques could readily be adapted for use in the present invention.

Figure 1:
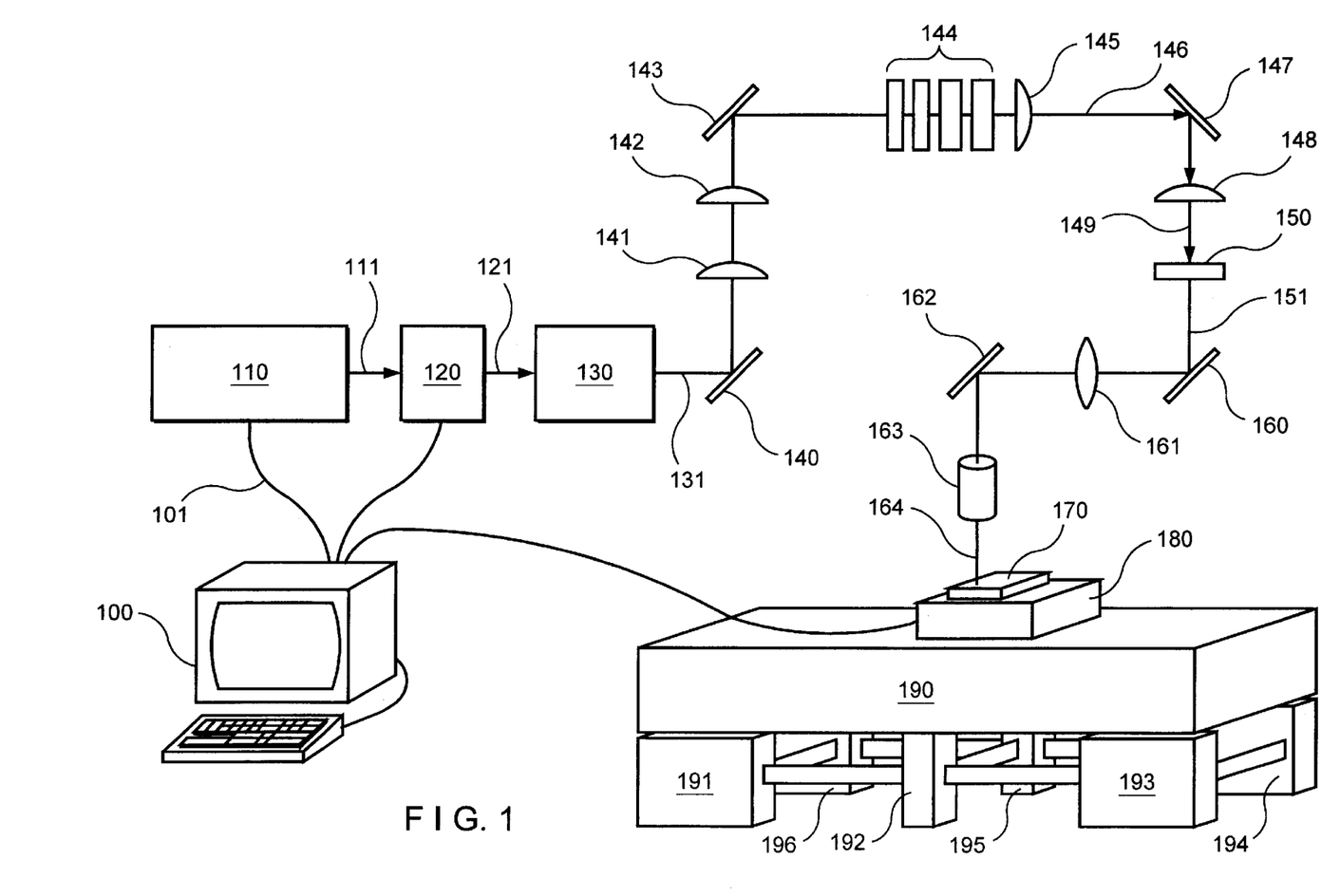
FIG. 1 is a functional diagram of a system for performing the lateral solidification process preferred to implement a preferred process of the present invention.

With reference to FIG. 1, our co-pending patent application describes as a preferred embodiment a system including excimer laser 110, energy density modulator 120 to rapidly change the energy density of laser beam 111, beam attenuator and shutter 130, optics 140, 141, 142 and 143, beam homogenizer 144, lens system 145, 146, 148, masking system 150, lens system 161, 162, 163, incident laser pulse 164, thin silicon film sample 170, sample translation stage 180, granite block 190, support system 191, 192, 193, 194, 195, 196, and managing computer 100 X and Y direction translation of the silicon sample 170 may be effected by either movement of a mask 210 within masking system 150 or by movement of the sample translation stage 180 under the direction of computer 100.

As described in further detail in our co-pending application, an amorphous silicon thin film sample is processed into a single or polycrystalline silicon thin film by generating a plurality of excimer laser pulses of a predetermined fluence, controllably modulating the fluence of the excimer laser pulses, homoginizing the modulated laser pulses in a predetermined plane, masking portions of the homoginized modulated laser pulses into patterned beamlets, irradiating an amorphous silicon thin film sample with the patterned beamlets to effect melting of portions thereof corresponding to the beamlets, and controllably translating the sample with respect to the patterned beam lets and with respect to the controlled modulation to thereby process the amorphous silicon thin film sample into a single or polycrystalline silicon thin film by sequential translation of the sample relative to the patterned beamlets and irradiation of the sample by patterned beamlets of varying fluence at corresponding sequential locations thereon. The following embodiments of the present invention will now be described with reference to the foregoing processing technique.

Figure 2A:
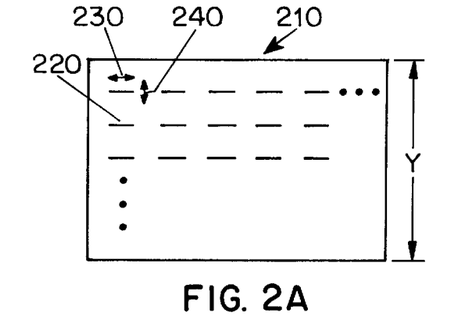
FIG. 2a is an illustrative diagram showing a mask having a dashed pattern.

Referring to FIGS. 2a and b, a first embodiment of the present invention will now be described. FIG. 2a illustrates a mask 210 incorporating a pattern of slits 220. The mask 210 is preferably fabricated from a quartz substrate, and includes either a metallic or dielectric coating which is etched by conventional techniques to form a mask pattern, such as that shown in FIG. 2a. Each slit 220 is of a breadth 230 which is chosen in accordance with the necessary dimensionality of the device that will be fabricated on the sample 170 in the particular location that corresponds to the slit 220. For example, the slits 220 should be approximately 25 micrometers across to fabricate a 25 micrometer semiconductor device, or in the case of a multi-part device, a channel in a device, in sample 170. The width 240 of the slit 220 is preferably between approximately two and five micrometers in order to be small enough to avoid nucleation in sample 170 and large enough to maximize lateral crystal growth for each excimer pulse. It should be understood that although FIG. 2a illustrates a regular pattern of slits 220, any pattern of slits could be utilized in accordance with the microstructures desired to be fabricated on film 170.

Figure 2B:
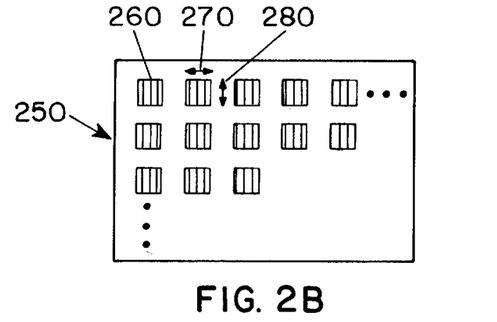
FIG. 2b is an illustrative diagram of a crystallized silicon film resulting from the use of the mask shown in FIG. 2a in the system of FIG. 1.

In accordance with the present invention, the sample 170 is translated with respect to the laser pulses 164, either by movement of masking system 150 or sample translation stage 180, in order to grow crystal regions in the sample 170. When the sample 170 is translated in the Y direction and mask 210 is used in masking system 150, a processed sample 250 having crystallized regions 260 is produced, as shown in FIG. 2b. The breadth 270 of each crystallized region will be approximately equal to the breadth 230 in the mask 210. The length 280 of each region will be approximately equal to the distance of Y translation effected by movement of the masking system 150 or translation stage 180, and as with the breadth, should be chosen in accordance with the final device characteristics. Each crystal region 260 will consist of polysilicon with long and directionally controlled grains.

Figure 3A:
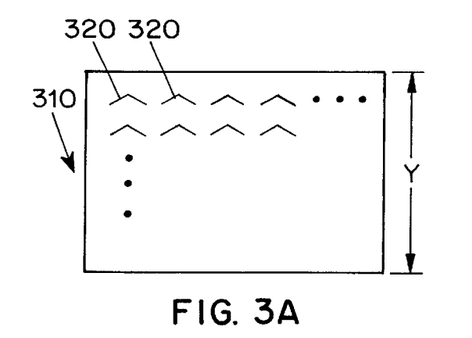
FIG. 3a is an illustrative diagram showing a mask having a chevron pattern.
Figure 3B:
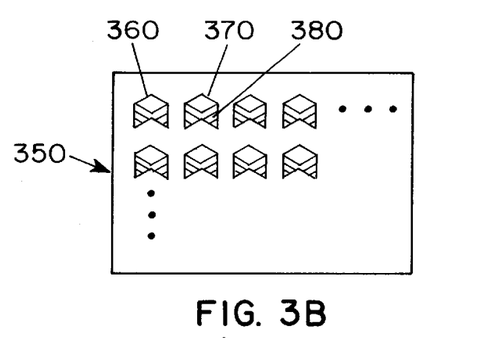
FIG. 3b is an illustrative diagram of a crystallized silicon film resulting from the use of the mask shown in FIG. 3a in the system of FIG. 1.

Referring next to FIGS. 3a and b, a second embodiment of the present invention will now be described. FIG. 3a illustrates a mask 310 incorporating a pattern of chevrons 320. The breadth 320 of each chevron side will determine the size of the ultimate single crystal region to be formed in sample 170. When the sample 170 is translated in the Y direction and mask 310 is used in masking system 150, a processed sample 350 having crystallized regions 360 is produced, as shown in FIG. 3b. Each crystal region 360 will consist of a diamond shaped single crystal region 370 and two long grained, directionally controlled polycrystalline silicon regions 380 in the tails of each chevron.

While the embodiments described with reference to FIGS. 2 and 3 are advantageous to generate spatially separated devices on silicon sample 170, at least some of the silicon sample 170 is not utilized in the final semiconductor. In order to facilitate a more flexible configuration of devices that can be developed on the semiconductor sample 170, the following preferred embodiments will now be described.

Figure 4A:
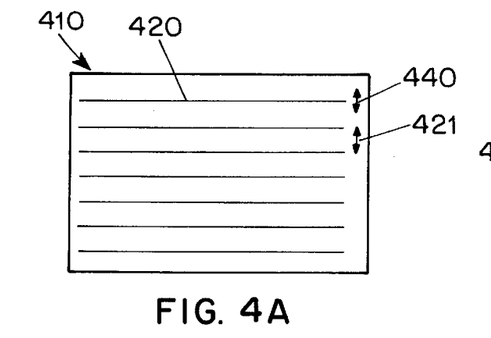
FIG. 4a is an illustrative diagram showing a mask having a line pattern.

Referring to FIGS. 4a and b, a third embodiment of the present invention will now be described. FIG. 4a illustrates a mask 410 incorporating a pattern of slits 410. Each slit 410 should extend as far across on the mask as the homogenized laser beam 149 incident on the mask permits, and must have a width 440 that is sufficiently narrow to prevent any nucleation from taking place in the irradiated region of sample 170. The width 440 will depend on a number of factors, including the energy density of the incident laser pulse, the duration of the incident laser pulse, the thickness of the silicon thin film sample, and the temperature and conductivity of the silicon substrate. For example, the slit should not be more than 2 micrometers wide when a 500 Angstrom film is to be irradiated at room temperature with a laser pulse of 30 ns and having an energy density that slightly exceeds the complete melt threshold of the sample.

Figure 4B:
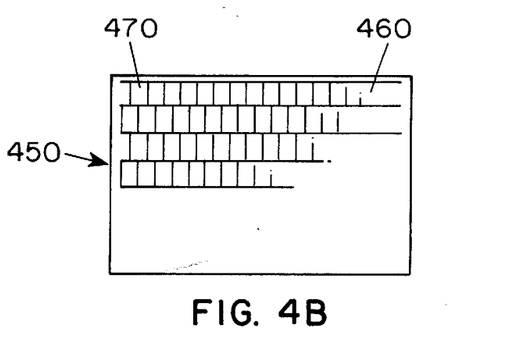
FIG. 4b is an illustrative diagram of a crystallized silicon film resulting from the use of the mask shown in FIG. 4a in the system of FIG. 1.

When the sample 170 is translated in the Y direction and mask 410 is used in masking system 150, a processed sample 450 having crystallized regions 460 is produced, as shown in FIG. 4b. Each crystal region 460 will consist of long grained, directionally controlled crystals 470. Depending on the periodicity 421 of the masking slits 420 in sample 410, the length of the grains 470 will be longer or shorter. In order to prevent amorphous silicon regions from being left on sample 170, the Y translation distance must be at least as long as the distance 421 between mask lines, and it is preferred that the translation be at least one micron greater than this distance 421 to eliminate small crystals that inevitably form at the initial stage of a directionally controlled polycrystalline structure.

Figure 5A:
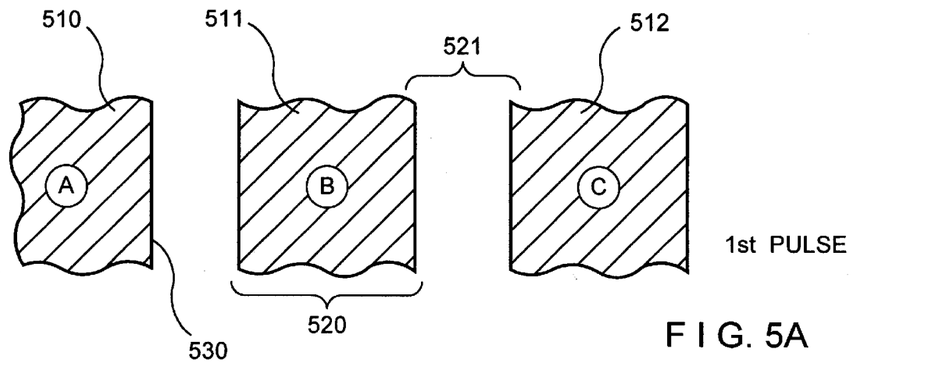
FIG. 5a is an illustrative diagram showing irradiated areas of a silicon sample using a mask having a line pattern.
Figure 5B:
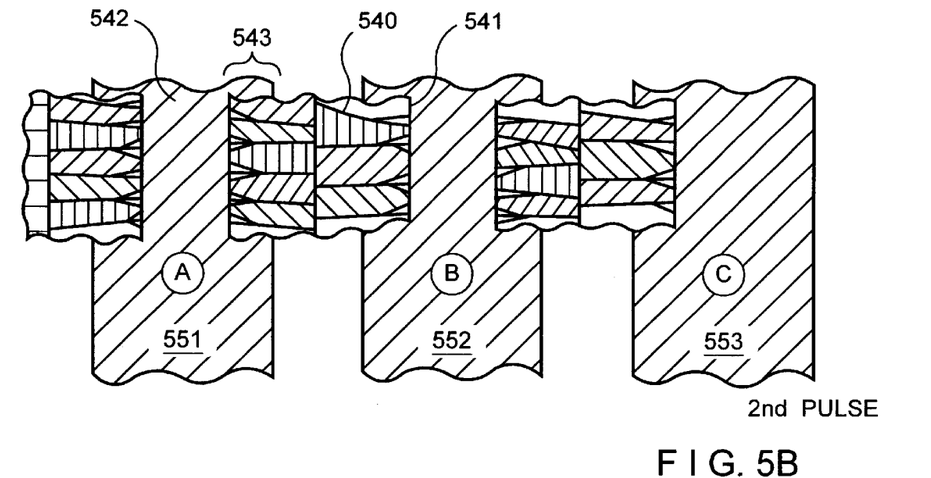
FIG. 5b is an illustrative diagram showing irradiated areas of a silicon sample using a mask having a line pattern after initial irradiation and sample translation has occurred.

An especially preferred technique using a mask having a pattern of lines will next be described. Using a mask as shown in FIG. 4a where closely packed mask lines 420 having a width 440 of 4 micrometers are each spaced 2 micrometers apart, the sample 170 is irradiated with one laser pulse. As shown in FIG. 5a, the laser pulse will melt regions 510, 511, 512 on the sample, where each melt region is approximately 4 micrometers wide 520 and is spaced approximately 2 micrometers apart 521. This first laser pulse will induce the formation of crystal growth in the irradiated regions 510, 511, 512, starting from the melt boundaries 530 and proceeding into the melt region, so that polycrystalline silicon 540 forms in the irradiated regions, as shown in FIG. 5b.

Figure 5C:
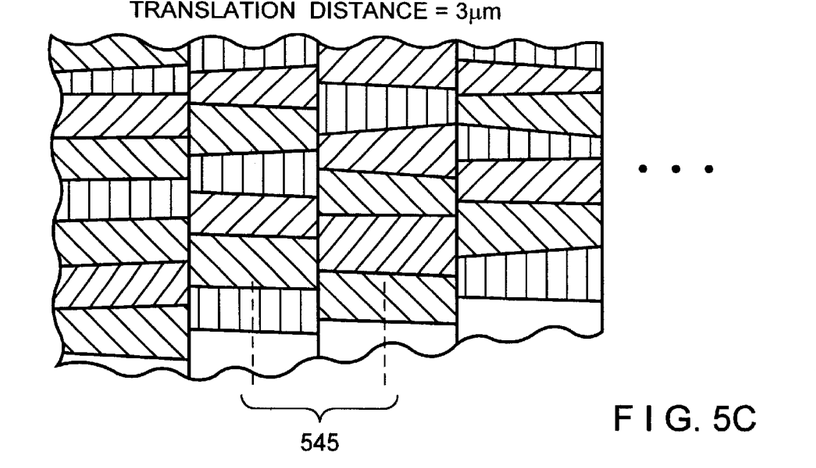
FIG. 5c is an illustrative diagram showing a crystallized silicon film after a second irradiation has occurred.

In order to eliminate the numerous small initial crystals 541 that form at the melt boundaries 530, the sample 170 is translated three micrometers in the Y direction and again irradiated with a single excimer laser pulse. The second irradiation regions 551, 552, 553 cause the remaining amorphous silicon 542 and initial crystal regions 543 of the polycrystalline silicon 540 to melt, while leaving the central section 545 of the polycrystalline silicon to remain. As shown in FIG. 5c, the crystal structure which forms the central section 545 outwardly grows upon solidification of melted regions 542, 542, so that a directionally controlled long grained polycrystalline silicon device is formed on sample 170.

Figure 6A:
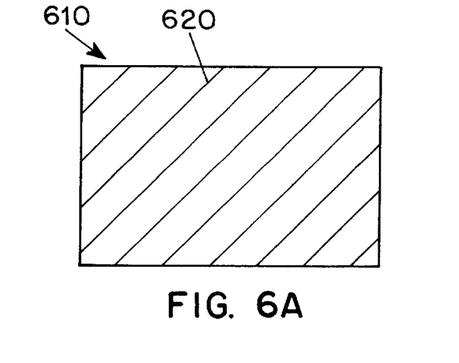
FIG. 6a is an illustrative diagram showing a mask having a diagonal line pattern.
Figure 6B:
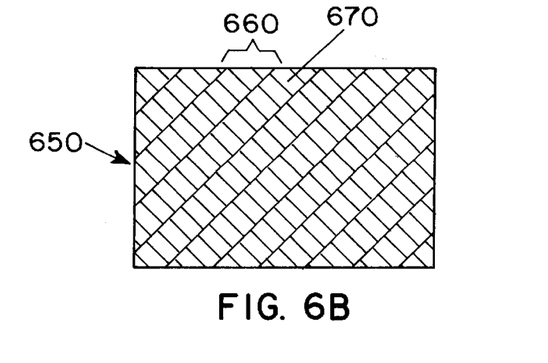
FIG. 6b is an illustrative diagram of a crystallized silicon film resulting from the use of the mask shown in FIG. 6a in the system of FIG. 1.

Referring to FIGS. 6a and b, a fourth embodiment of the present invention will now be described. FIG. 6a illustrates a mask 610 incorporating a pattern of diagonal lines 620. When the sample 170 is translated in the Y direction and mask 610 is used in masking system 150, a processed sample 650 having crystallized regions 660 is produced, as shown in FIG. 6b. Each crystal region 660 will consist of long grained, directionally controlled crystals 670.

As with the embodiment described above with respect to FIGS. 4a and b, the translation distance will depend on the desired crystal length. Also, the process described with reference to FIGS. 5a–c could readily be employed using a mask as shown in FIG. 6a, having 4 micrometer wide lines 620 that are each spaced apart by 2 micrometers. This embodiment is especially advantageous in the fabrication of displays or other devices that are oriented with respect to an XY axis, as the polycrystalline structure is not orthogonal to that axis and accordingly, the device performance will be independent of the X or Y coordinates.

Figure 7A:
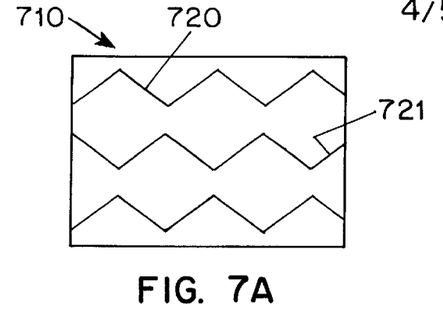
FIG. 7a is an illustrative diagram showing a mask having a sawtooth pattern.
Figure 7B:
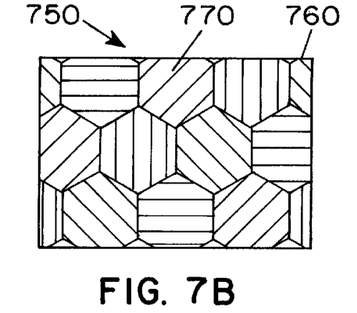
FIG. 7b is an illustrative diagram of a crystallized silicon film resulting from the use of the mask shown in FIG. 7a in the system of FIG. 1.

Referring next to FIGS. 7a and b, a fifth embodiment of the present invention will now be described. FIG. 7a illustrates a mask 710 incorporating offset sawtooth wave patterns 720, 721. When the sample 170 is translated in the Y direction and mask 710 is used in masking system 150, a processed sample 750 having crystallized regions 760 is produced, as shown in FIG. 7b. Each crystal region 760 will consist of a row of hexagonal-rectangular crystals 770. If the translation distance is slightly greater than the periodicity of the sawtooth pattern, the crystals will be hexagons. This embodiment is beneficial in the generation of larger silicon grains and may increase device performance.

Figure 8A:
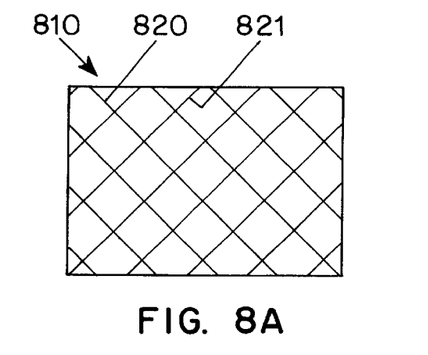
FIG. 8a is an illustrative diagram showing a mask having a crossing diagonal line pattern.
Figure 8B:
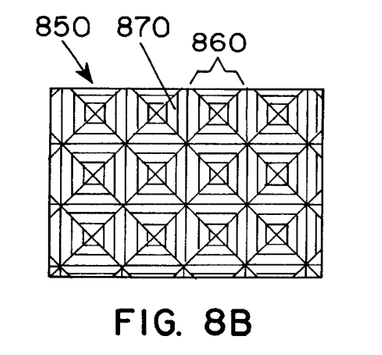
FIG. 8b is an illustrative diagram of a crystallized silicon film resulting from the use of the mask shown in FIG. 8a in the system of FIG. 1.

Referring next to FIGS. 8a and b, a sixth embodiment of the present invention will now be described. FIG. 8a illustrates a mask 810 incorporating a diagonal cross pattern 821, 822. When the sample 170 is translated in the Y direction and mask 810 is used in masking system 150, a processed sample 850 having crystallized regions 860 is produced, as shown in FIG. 8b. Each crystal region 860 will consist of a row of diamond shaped crystals 870. If the translation distance is slightly greater than the periodicity of the pattern, the crystals will be squares. This embodiment is also beneficial in the generation of larger silicon grains and may increase device performance.

Figure 9A:
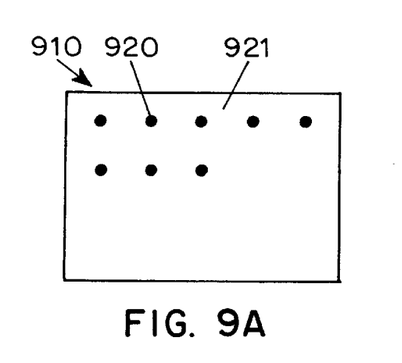
FIG. 9a is an illustrative diagram showing a mask having a polka-dot pattern.
Figure 9B:
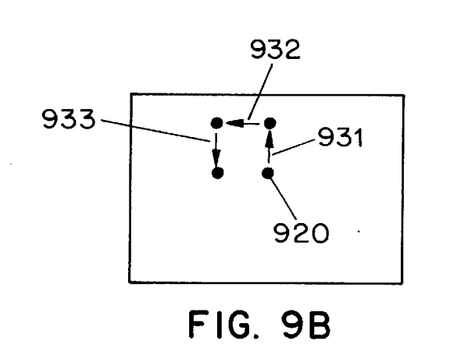
Figure 9C:
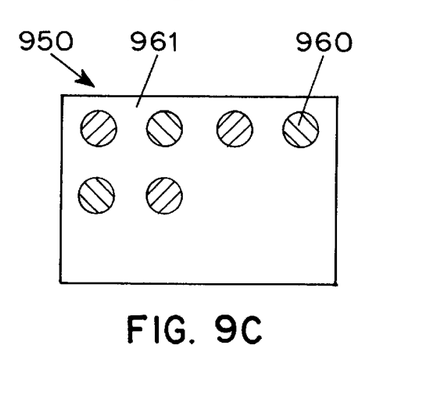
FIG. 9c is an illustrative diagram of a crystallized silicon film resulting from the use of the mask shown in FIG. 9a in the system of FIG. 1 using the mask translation scheme shown in FIG. 9b.
Figure 9D:
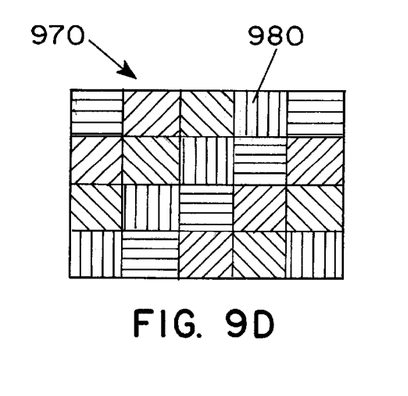
FIG. 9d is an illustrative diagram of an alternative crystallized silicon film resulting from the use of the mask shown in FIG. 9a in the system of FIG. 1 using the mask translation scheme shown in FIG. 9b.

Referring next to FIGS. 9a–d, a seventh embodiment of the present invention will now be described. FIG. 9a illustrates a mask 910 incorporating a polka-dot pattern 920. The polka-dot mask 910 is an inverted mask, where the polka-dots 920 correspond to masked regions and the remainder of the mask 921 is transparent. In order to fabricate large silicon crystals, the polka-dot pattern may be sequentially translated about the points on the sample 170 where such crystals are desired. For example, as shown in FIG. 9b, the polka-dot mask may be translated 931 a short distance in the positive Y direction after a first laser pulse, a short distance in the negative X direction 932 after a second laser pulse, and a short distance in the negative Y direction 933 after a third laser pulse to induce the formation of large crystals. If the separation distance between polka-dots is greater than two times the lateral growth distance, a crystalline structure 950 where crystals 960 separated by small grained polycrystalline silicon regions 961 is generated, as shown in FIG. 9c. If the separation distance is less or equal to two times the lateral growth distance so as to avoid nucleation, a crystalline structure 970 where crystals 980 are generated, as shown in FIG. 9d.

Figure 10:
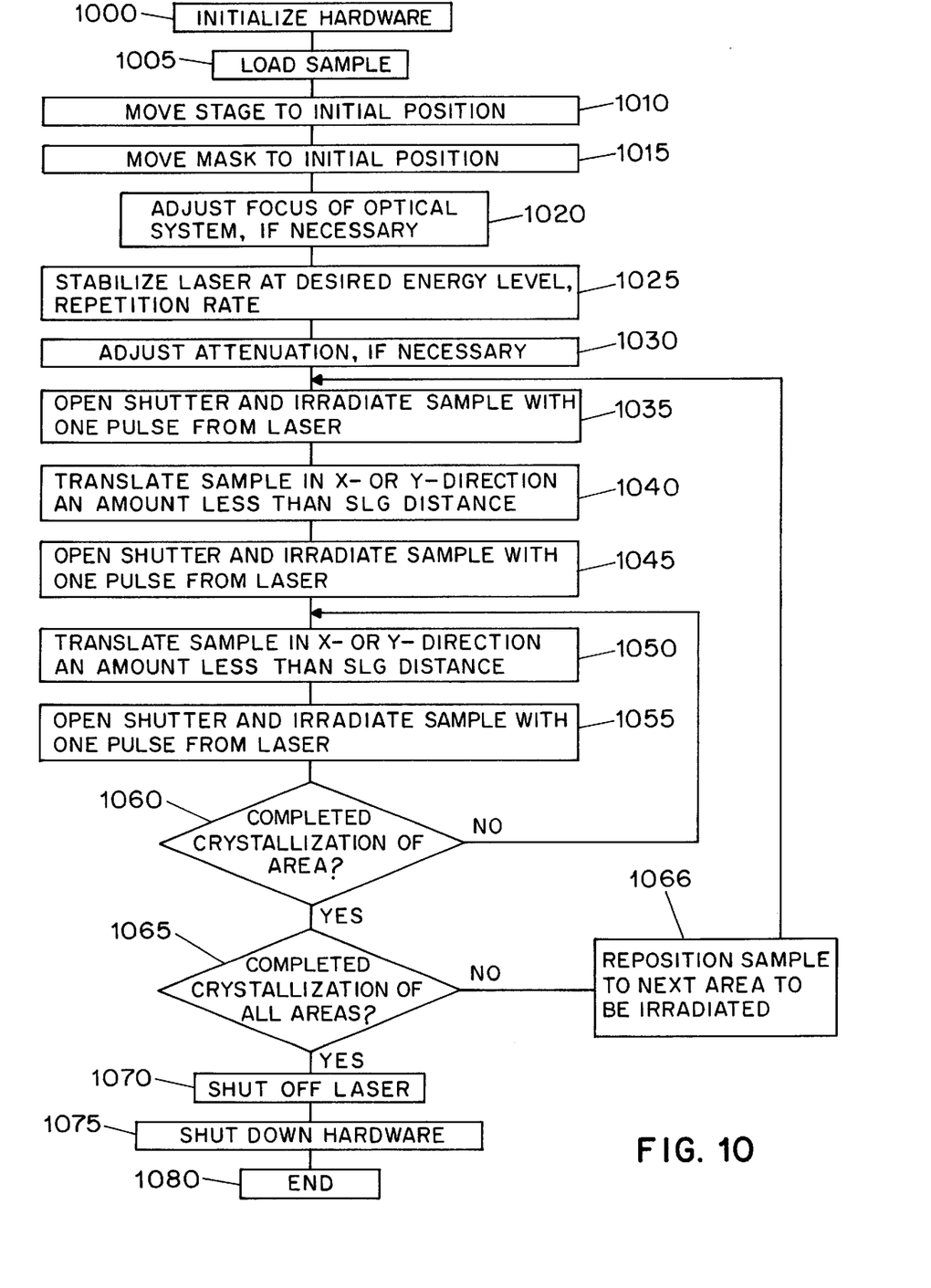
FIG. 10 is a flow diagram illustrating the steps implemented in the system of FIG. 1.

Referring next to FIG. 10, the steps executed by computer 100 to control the crystal growth process implemented with respect to FIG. 9 will be described. FIG. 10 is a flow diagram illustrating the basic steps implemented in the system of FIG. 1. The various electronics of the system shown in FIG. 1 are initialized 1000 by the computer to initiate the process. A thin silicon film sample is then loaded onto the sample translation stage 1005. It should be noted that such loading may be either manual or robotically implemented under the control of computer 100. Next, the sample translation stage is moved into an initial position 1015, which may include an alignment with respect to reference features on the sample. The various optical components of the system are focused 1020 if necessary. The laser is then stabilized 1025 to a desired energy level and reputation rate, as needed to fully melt the silicon sample in accordance with the particular processing to be carried out. If necessary, the attenuation of the laser pulses is finely adjusted 1030.

Next, the shutter is opened 1035 to expose the sample to a single pulse of irradiation and accordingly, to commence the sequential lateral solidification process. The sample is translated in the X or Y directions 1040 in an amount less than the super lateral grown distance. The shutter is again opened 1045 to expose the sample to a single pulse of irradiation, and the sample is again translated in the X or Y directions 1050 in an amount less than the super lateral growth distance. Of course, if the sample was moved in the X direction in step 1040, the sample should be moved in the Y direction in Step 1050 in order to create a polka-dot. The sample is then irradiated with a third laser pulse 1055. The process of sample translation and irradiation 1050, 1055 may be repeated 1060 to grow the polka-dot region with four or more laser pulses.

Next, if other areas on the sample have been designated for crystallization, the sample is repositioned 1065, 1066 and the crystallization process is repeated on the new area. If no further areas have been designated for crystallization, the laser is shut off 1070, the hardware is shut down 1075, and the process is completed 1080. Of course, if processing of additional samples is desired or if the present invention is utilized for batch processing, steps 1005, 1010, and 1035–1065 can be repeated on each sample.

The foregoing merely illustrates the principles of the invention. Various modifications and alterations to the described embodiments will be apparent to those skilled in the art in view of the teachings herein. For example, the thin silicon film sample 170 could be replaced by a sample having pre-patterned islands of silicon film. Also, the line pattern mask could be used to grow polycrystalline silicon using two laser pulses as explained with reference to FIGS. 5a–c, then rotated by 90 degrees and used again in the same process to generate an array of square shaped single crystal silicon. It will thus be appreciated that those skilled in the art will be able to devise numerous systems and methods which, although not explicitly shown or described herein, embody the principles of the invention and are thus within the spirit and scope of the invention.

We claim:

1. A method for processing an amorphous silicon thin film sample into a polycrystalline silicon thin film, comprising the steps of:
    (a) generating a sequence of excimer laser pulses;
    (b) controllably modulating each excimer laser pulse in said sequence to a predetermined fluence;
    (c) homogenizing each modulated laser pulse in said sequence in a predetermined plane;
    (d) masking portions of each homogenized fluence controlled laser pulse in said sequence with a two dimensional pattern of slits to generate a sequence of fluence controlled pulses of line patterned beamlets, each slit in said pattern of slits being sufficiently narrow to prevent inducement of significant nucleation in region of a silicon thin film sample irradiated by a beamlet corresponding to said slit,
    (e) irradiating an amorphous silicon thin film sample with said sequence of fluence controlled slit patterned beamlets to effect melting of portions thereof corresponding to each fluence controlled patterned beamlet pulse in said sequence of pulses of patterned beamlets; and
    (f) controllably sequentially translating a relative position of said sample with respect to each of said fluence controlled pulse of slit patterned beamlets to thereby process said amorphous silicon thin film sample, wherein step (b) is performed in real-time during at least one of step (e) and step (f).

2. The method of claim 1, wherein said masking step comprises masking portions of each homogenging fluence controlled laser pulse in said sequence with a two dimensional pattern of substantially parallel straight slits spaced a predetermined distance apart and linearly extending parallel to one direction of said plane of homogenigation to generate a sequence of fluence controlled pulses of slit patterned beamlets.

3. The method of claim 2, wherein said translating step comprises controllably sequentially translating said relative position of said sample in a direction perpendicular to each of said fluence controlled pulse of slit patterned beamlets over substantially said predetermined slit spacing distance, to thereby process said amorphous silicon thin film sample into polycrystalline silicon thin film having long grained, directionally controlled crystals.

4. The method of claim 1, wherein, after step (e), each of the irradiated portions of said sample includes a respective molten zone, and wherein a lateral grain growth is effectuated in each of said respective molten zones.

5. The method of claim 1, wherein said amorphous silicon thin film sample is processed into at least one of a single crystalline silicon thin film and a polycrystalline silicon thin film.

6. A method for processing an amorphous silicon thin film sample into a polycrystalline silicon thin film, comprising the steps of:
    (a) generating a sequence of excimer laser pulses;
    (b) controllably modulating each excimer laser pulse in said sequence to a predetermined fluence;
    (c) homogenizing each modulated laser pulse in said sequence in a predetermined plane;
    (d) masking portions of each homogenized fluence controlled laser pulse in said sequence with a two dimensional pattern of slits to generate a sequence of fluence controlled pulses of line patterned beamlets, each slit in said pattern of slits being sufficiently narrow to prevent inducement of significant nucleation in region of a silicon thin film sample irradiated by a beamlet corresponding to said slit,
    (e) irradiating an amorphous silicon thin film sample with said sequence of fluence controlled slit patterned beamlets to effect melting of portions thereof corresponding to each fluence controlled patterned beamlet pulse in said sequence of pulses of patterned beamlets; and
    (f) controllably sequentially translating a relative position of said sample with respect to each of said fluence controlled pulse of slit patterned beamlets to thereby process said amorphous silicon thin film sample, wherein:
        (a) said masking step comprises masking portions of each homogenized fluence controlled laser pulse in said sequence with a two dimensional pattern of substantially parallel straight slits of a predetermined width, spaced a predetermined distance being less than said predetermined width apart, and linearly extending parallel to one direction of said plane of homogenization to generate a sequence of fluence controlled pulses of slit patterned beamlets; and
        (b) said translating step comprises translating by a distance less than said predetermined width said relative position of said sample in a direction perpendicular to each of said fluence controlled pulse of slit patterned beamlets, to the to thereby process said amorphous silicon thin film sample into polycrystalline silicon thin film having long grained, directionally controlled crystals using two laser pulses.

7. The method of claim 6, wherein said predetermined width is approximately 4 micrometers, said predetermined spacing distance is approximately 2 micrometers, and said translating distance is approximately 3 micrometers.

8. A method for processing an amorphous silicon thin film sample into a polycrystalline silicon thin film, comprising the steps of:
   (a) generating a sequence of excimer laser pulses;
   (b) controllably modulating each excimer laser pulse in said sequence to a predetermined fluence;
   (c) homogenizing each modulated laser pulse in said sequence in a predetermined plane;
   (d) masking portions of each homogenized fluence controlled laser pulse in said sequence with a two dimensional pattern of slits to generate a sequence of fluence controlled pulses of line patterned beamlets, each slit in said pattern of slits being sufficiently narrow to prevent inducement of significant nucleation in region of a silicon thin film sample irradiated by a beamlet corresponding to said slit,
   (e) irradiating an amorphous silicon thin film sample with said sequence of fluence controlled slit patterned beamlets to effect melting of portions thereof corresponding to each fluence controlled patterned beamlet pulse in said sequence of pulses of patterned beamlets; and
   (f) controllably sequentially translating a relative position of said sample with respect to each of said fluence controlled pulse of slit patterned beamlets to thereby process said amorphous silicon thin film sample, wherein said masking step comprises masking portions of each homogenized fluence controlled laser pulse in said sequence with a two dimensional pattern of substantially parallel straight slits spaced a predetermined distance apart and linearly extending at substantially 45 degree angle with respect to one direction of said plane of homogenization to generate a sequence of fluence controlled pulses of slit patterned beamlets.

9. The method of claim 8, wherein said translating step comprises controllably sequentially translating said relative position of said sample in a direction parallel to said one direction of said plane of homogeningation substantially said predetermined slit distance, to thereby process said amorphous silicon thin film sample into polycrystalline silicon thin film having long grained, directionally controlled crystals that are disoriented with respect to the XY axis of the thin silicon film.

10. A method for processing an amorphous silicon thin film sample into a polycrystalline silicon thin film, comprising the steps of:
   (a) generating a sequence of excimer laser pulses;
   (b) controllably modulating each excimer laser pulse in said sequence to a predetermined fluence;
   (c) homogenizing each modulated laser pulse in said sequence in a predetermined plane;
   (d) masking portions of each homogenized fluence controlled laser pulse in said sequence with a two dimensional pattern of slits to generate a sequence of fluence controlled pulses of line patterned beamlets, each slit in said pattern of slits being sufficiently narrow to prevent inducement of significant nucleation in region of a silicon thin film sample irradiated by a beamlet corresponding to said slit,
   (e) irradiating an amorphous silicon thin film sample with said sequence of fluence controlled slit patterned beamlets to effect melting of portions thereof corresponding to each fluence controlled patterned beamlet pulse in said sequence of pulses of patterned beamlets; and
   (f) controllably sequentially translating a relative position of said sample with respect to each of said fluence controlled pulse of slit patterned beamlets to thereby process said amorphous silicon thin film sample, wherein:
      (a) said masking step comprises masking portions of each homogenized fluence controlled laser pulse in said sequence with a two dimensional pattern of substantially parallel straight slits of a predetermined width, spaced a predetermined distance being less than said predetermined width apart, and linearly extending at substantially 45 degree angle with respect to one direction of said plane of homogenization to generate a sequence of fluence controlled pulses of slit patterned beamlets; and
      (b) said translating step comprises translating by a distance less than said predetermined width said relative position of said sample in a direction parallel to said one direction of said plane of homogenization, to the to thereby process said amorphous silicon thin film sample into polycrystalline silicon thin film having long grained, directionally controlled crystals that are disoriented with respect to the XY axis of the thin silicon film using two laser pulses.

11. The method of claim 10, wherein said predetermined width is approximately 4 micrometers, said predetermined spacing distance is approximately 2 micrometers, and said translating distance is approximately 3 micrometers.

12. A method for processing an amorphous silicon thin film sample into a polycrystalline silicon thin film, comprising the steps of:
   (a) generating a sequence of excimer laser pulses;
   (b) controllably modulating each excimer laser pulse in said sequence to a predetermined fluence;
   (c) homogenizing each modulated laser pulse in said sequence in a predetermined plane;
   (d) masking portions of each homogenized fluence controlled laser pulse in said sequence with a two dimensional pattern of slits to generate a sequence of fluence controlled pulses of line patterned beamlets, each slit in said pattern of slits being sufficiently narrow to prevent inducement of significant nucleation in region of a silicon thin film sample irradiated by a beamlet corresponding to said slit,
   (e) irradiating an amorphous silicon thin film sample with said sequence of fluence controlled slit patterned beamlets to effect melting of portions thereof corresponding to each fluence controlled patterned beamlet pulse in said sequence of pulses of patterned beamlets; and
   (f) controllably sequentially translating a relative position of said sample with respect to each of said fluence controlled pulse of slit patterned beamlets to thereby process said amorphous silicon thin film sample,
      wherein said masking step comprises masking portions of each homogenized fluence controlled laser pulse in said sequence with a two dimensional pattern of intersecting straight slits, a first group of straight slits being spaced a first predetermined apart and linearly extending at substantially 45 degree angle with respect to a first direction of said plane of homogenization, and a second group of straight slits being spaced a second predetermined distance apart and linearly extending at substantially 45 degree angle with respect to a second direction of said plane of homogenization and intersecting said first group at substantially a 90 degree angle, to generate a sequence of fluence controlled pulses of slit patterned beamlets.

13. The method of claim 12, said translating step comprises controllably sequentially translating said relative position of said sample in a direction parallel to said first direction of said plane of homogeningation substantially said first predetermined slit spacing distance, to thereby process said amorphous silicon thin film sample into polycrystalline silicon thin film having large diamond shaped crystals.

14. A method for processing an amorphous silicon thin film sample into a polycrystalline silicon thin film, comprising the steps of:
 (a) generating a sequence of excimer laser pulses;
 (b) controllably modulating each excimer laser pulse in said sequence to a predetermined fluence;
 (c) homogenizing each modulated laser pulse in said sequence in a predetermined plane;
 (d) masking portions of each homogenized fluence controlled laser pulse in said sequence with a two dimensional pattern of slits to generate a sequence of fluence controlled pulses of line patterned beamlets, each slit in said pattern of slits being sufficiently narrow to prevent inducement of significant nucleation in region of a silicon thin film sample irradiated by a beamlet corresponding to said slit,
 (e) irradiating an amorphous silicon thin film sample with said sequence of fluence controlled slit patterned beamlets to effect melting of portions thereof corresponding to each fluence controlled patterned beamlet pulse in said sequence of pulses of patterned beamlets; and
 (f) controllably sequentially translating a relative position of said sample with respect to each of said fluence controlled pulse of slit patterned beamlets to thereby process said amorphous silicon thin film sample,
  wherein said masking step comprises masking portions of each homogenized fluence controlled laser pulse in said sequence with a two dimensional pattern of sawtooth shaped slits spaced a predetermined distance apart and extending generally parallel to one direction of said plane of homogenization to generate a sequence of fluence controlled pulses of slit patterned beamlets.

15. The method of claim 14, wherein said translating step comprises controllably sequentially translating said relative position of said sample in a direction perpendicular to each of said fluence controlled pulse of slit patterned beamlets over substantially said predetermined slit spacing distance, to thereby process said amorphous silicon thin film sample into polycrystalline silicon thin film having large hexagonal crystals.

16. A method for processing an amorphous silicon thin film sample into a polycrystalline silicon thin film, comprising the steps of:
 (a) generating a sequence of excimer laser pulses;
 (b) homogenizing each laser pulse in said sequence in a predetermined plane;
 (c) masking portions of each homogenized laser pulse in said sequence with a two dimensional pattern of substantially opaque dots to generate a sequence of pulses of dot patterned beamlets;
 (d) irradiating an amorphous silicon thin film sample with a particular beam pulse of said sequence of dot patterned beamlets having a predetermined size to effect melting of portions of the film sample at first locations thereof such that the melted portions at the first locations thereafter solidify;
 (e) controllably sequentially translating said sample relative to each of said pulses of dot patterned beamlets by alternating a translation direction in two perpendicular axis and in a distance less than the super lateral grown distance for said sample to reach second locations; and
 (f) at the second location, irradiating said portions of the irradiated and solidified sample with a subsequent beam pulse of said sequence of beam pulses which include said dot patterned beamlets having the predetermined size to effect further melting of said portions thereof.

17. The method of claim 16, wherein step (b) is performed in real-time during at least one of step (d) and step (e).

18. A method for processing an amorphous silicon thin film sample into a polycrystalline silicon thin film, comprising the steps of:
 (a) generating a sequence of excimer laser pulses;
 (b) controllably modulating each excimer laser pulse in said sequence to a predetermined fluence;
 (c) homogenizing each modulated laser pulse in said sequence in a predetermined plane;
 (d) masking portions of each homogenized fluence controlled laser pulse in said sequence with a two dimensional pattern of slits to generate a sequence of fluence controlled pulses of line patterned beamlets, each slit in said pattern of slits being sufficiently narrow to prevent inducement of significant nucleation in region of a silicon thin film sample irradiated by a beamlet corresponding to said slit,
 (e) irradiating an amorphous silicon thin film sample with said sequence of fluence controlled slit patterned beamlets to effect melting of portions thereof corresponding to each fluence controlled patterned beamlet pulse in said sequence of pulses of patterned beamlets; and
 (f) controllably sequentially translating a relative position of said sample with respect to each of said fluence controlled pulse of slit patterned beamlets to thereby process said amorphous silicon thin film sample, wherein each excimer laser pulse is controllably modulated in said sequence based on dimensions of said slits.

19. A method for processing an amorphous silicon thin film sample into a polycrystalline silicon thin film, comprising the steps of:
 (a) generating a sequence of excimer laser pulses;
 (b) controllably modulating each excimer laser pulse in said sequence to a predetermined fluence;
 (c) homogenizing each modulated laser pulse in said sequence in a predetermined plane;
 (d) masking portions of each homogenized fluence controlled laser pulse in said sequence with a two dimensional pattern of slits to generate a sequence of fluence controlled pulses of line patterned beamlets, each slit in said pattern of slits being sufficiently narrow to prevent inducement of significant nucleation in region of a silicon thin film sample irradiated by a beamlet corresponding to said slit,
 (e) irradiating an amorphous silicon thin film sample with said sequence of fluence controlled slit patterned beamlets to effect melting of portions thereof corresponding to each fluence controlled patterned beamlet pulse in said sequence of pulses of patterned beamlets; and (f) controllably sequentially translating a relative position of said sample with respect to each of said fluence controlled pulse of slit patterned beamlets to thereby process said amorphous silicon thin film sample, wherein, after step (e), each of the irradiated portions of said sample includes a respective molten zone, and wherein a lateral grain growth is effectuated in each of said respective molten zones, and wherein said relative position of said sample is sequentially translated with respect to each of said fluence controlled pulse of said slit patterned beamlets for a distance which is greater than said lateral grain growth and smaller than said respective molten zone.

20. A method for processing an amorphous silicon thin film sample into a polycrystalline silicon thin film, comprising the steps of:

(a) generating a sequence of excimer laser pulses;

(b) masking portions of each laser pulse in the sequence with a predefined pattern of openings in a mask having openings to generate a sequence of pulses of beamlets the shape of which at least partially corresponds to the shape of the predefined pattern;

(c) irradiating the thin film sample with the sequence of pulses of the beamlets having a predetermined size to effect melting of first portions of the thin film sample corresponding to the shape of the predefined pattern of the openings in the mask;

(d) based on dimensions of the openings of the mask, translating at least one of the thin film sample and the excimer laser pulses relative to the other one of the thin film sample and the excimer laser pulse so as to reach a further location; and (e) after step (d), irradiating second portions of the thin film sample which correspond to sections of the further location using the sequence of pulses so as to at least partially melt the second portions, wherein the second portions partially overlap the first portions.

21. The method according to claim 20, wherein the second portions only partially overlap less than one half of the first portions.

22. A method for processing a silicon thin film sample, comprising the steps of:

(a) generating a sequence of excimer laser pulses;

(b) masking portions of each laser pulse in said sequence with a two dimensional pattern of substantially opaque dots to generate a sequence of pulses of dot patterned beamlets;

(c) irradiating the thin film sample with a particular pulse of said sequence of laser pulses having substantially dot patterned beamlets to effect melting of portions of the film sample at first locations thereof such that the melted portions at the first locations thereafter solidify;

(d) controllably translating the thin film sample relative to each of the pulses of dot patterned beamlets by a distance which is less than a lateral grown distance of grains on the thin film sample; and (e) at the second location, irradiating said portions of the irradiated and solidified sample with a subsequent pulse of said sequence of beam pulses which include said dot patterned beamlets having the predetermined size to effect further melting of said portions thereof.

23. A method for processing a silicon thin film sample, comprising the steps of:

(a) generating a sequence of excimer laser pulses;

(b) masking portions of each laser pulse in said sequence with a two dimensional pattern of substantially opaque dots to generate a sequence of pulses of dot patterned beamlets, the opaque dots preventing corresponding sections of each laser pulse from passing therethrough, and to form at least one masked laser pulse having dot patterned sections; and (c) irradiating the thin film sample with the at least one masked laser pulse to effect melting of portions of the film sample thereof, wherein the dot patterned sections corresponding in shape to the dots of the mask, and do not irradiate the thin film sample.

\* \* \* \* \*

UNITED STATES PATENT AND TRADEMARK OFFICE
CERTIFICATE OF CORRECTION

PATENT NO. : 6,555,449 B1
DATED : April 29, 2003
INVENTOR(S) : Im et al.

It is certified that error appears in the above-identified patent and that said Letters Patent is hereby corrected as shown below:

<u>Title page, Item [54] and Column 1, line 6,</u>
Title "SOLIDFICATION" should read -- SOLIDIFICATION --

<u>Title page,</u>
Item [56], References Cited, FOREIGN PATENT DOCUMENTS, "GB 2338343 9/2000" should be deleted
OTHER PUBLICATIONS "Endert et al.," reference "Micromaching" should read -- Micromachining --; "Sposili et al. " (first cite), "Reasearch" should read -- Research --; "Kim, H.J., " reference "Amorophus" should read -- Amorphous --; "Sposili et al." (second cite) reference "Solodification" should read -- Solidification, --; and "SiO2" should read -- $SiO_2$ --; "C.E Nebel," reference "A–SI:h" should read -- a-Si:H --; Overview ...etc.," reference "GMBH" should read -- GmbH --; "I.W. Boyd," reference "anmd" should read -- and --; and "H. Endert et al," "Micromaching" should read -- Micromachining --
Item [57] ABSTRACT,
Line 6, "homoginizing" should read -- homogenizing --

<u>Column 1,</u>
Line 37, "Bullitin" should read -- Bulletin --

<u>Column 2,</u>
Line 39, "excumer" should read -- excimer --
Line 21, "homoginizing" should read -- homogenizing --
Lines 36 and 49, "pulse" should read -- pulses --
Lines 50 and 67, "to the" should be deleted
Line 51, "into polycrystalline" should read -- into a polycrystalline --
Line 63, "translating" should read -- the translating --

<u>Column 3,</u>
Lines 1 and 20, "into polycrystalline" should read -- into a polycrystalline --
Lines 12 and 32, "stantially 45" should read -- stantially a 45 --
Lines 24, 44 and 64, "homoginized" should read -- homogenized --
Line 27, "predetermined" should read -- predetermined distance --
Line 28, "substantially 45" should read -- substantially a 45 --
Line 54, "pulse" should read -- pulses --
Line 55, "to the" should be deleted
Line 62, "homoginizing" should read -- homogenizing --

UNITED STATES PATENT AND TRADEMARK OFFICE
CERTIFICATE OF CORRECTION

PATENT NO. : 6,555,449 B1
DATED : April 29, 2003
INVENTOR(S) : Im et al.

It is certified that error appears in the above-identified patent and that said Letters Patent is hereby corrected as shown below:

Column 4,
Line 6, "axis" should read -- axes --

Column 5,
Line 57, "homoginizing" should read -- homogenizing --
Line 59, "homoginized" should read -- homogenized --
Line 63, "beam lets" should read -- beamlets --

Column 7,
Line 9, "lascr" should read -- laser --

Column 9,
Line 29, "pre-pattemed" should read -- pre-patterned --
Line 54, "in region" should read -- in a region --
Line 55, "slit," should read -- slit; --
Line 63, "of" (second occurrence) should be deleted Column 10,
Line 2, "homogenging" should read -- homogenizing --
Line 6, "homogenigation" should read -- homogenization --
Line 65, "to the" should be deleted Column 11,
Line 18, "in region" should read -- in a region --
Lines 20 and 63, "slit," should read -- slit; --
Line 28, "of" (second occurrence) should be deleted
Line 35, "substantially 45" should read -- substantially a 45 --
Line 42, "homogeningation" should read -- homogenization --; and "substantially" should read -- over substantially --
Line 44, "into polycrystalline" should read -- into a polycrystalline --
Line 62, "in region" should read -- in a region --

Column 12,
Lines 4 and 55, "of" (second occurrence) should be deleted
Lines 14, 63 and 67, "substantially 45" should read -- substantially a 45 --
Line 22, "to the" should be deleted
Line 45, "in region" should read -- in a region --
Line 47, "slit," should read -- slit; --
Line 62, "predetermined" should read -- predetermined distance"--

UNITED STATES PATENT AND TRADEMARK OFFICE
CERTIFICATE OF CORRECTION

PATENT NO. : 6,555,449 B1
DATED : April 29, 2003
INVENTOR(S) : Im et al.

It is certified that error appears in the above-identified patent and that said Letters Patent is hereby corrected as shown below:

Column 13,
Line 9, "homogeningation" should read -- homogenization -- and; "substantially" should read -- over substantially --
Line 11, "into poly-" should read -- into a poly --
Line 27, "in region" should read -- in a region --
Line 29, "slit," should read -- slit; --
Lines 36 (second occurrence) and 50, (first occurrence), "of" should be deleted
Line 53, "into polycrystalline" should read -- into a polycrystalline --

Column 14,
Line 8, "axis" should read -- axes --
Line 9, "second locations" should read -- the second location --
Lines 32 and 59, "in region" should read -- in a region --
Lines 34 and 61, "slit," should read -- slit; --
Line 41, "of" (second occurrence) should be deleted Column 15,
Lines 2 (second occurrence) and 10, (first occurrence), "of" should be deleted
Line 30, "pulses" should read -- pulse --

Column 16,
Lines 12 and 37, "film" should read -- thin film --
Line 37, "film" should read -- thin film --
Line 38, "corresponding" should read -- correspond --

Signed and Sealed this

First Day of June, 2004

JON W. DUDAS
*Acting Director of the United States Patent and Trademark Office*